(12) United States Patent
Heurich et al.

(10) Patent No.: US 11,340,739 B2
(45) Date of Patent: *May 24, 2022

(54) INPUT DEVICE WITH AN ARRAY OF FORCE SENSORS IN A FILM LAYER STRUCTURE WITH IMPROVED DURABILITY AND SIMPLIFIED PRODUCTION

(71) Applicant: PREH GMBH, Bad Neustadt a. d. Saale (DE)

(72) Inventors: David Heurich, Rödelmaier (DE); Matthias Lembach, Sandberg/OT Waldberg (DE); Ronald Schmidt, Oberhof (DE)

(73) Assignee: Preh GMBH, Bad Neustadt a.d. Saale (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/205,753

(22) Filed: Mar. 18, 2021

(65) Prior Publication Data
US 2021/0208708 A1 Jul. 8, 2021

Related U.S. Application Data

(63) Continuation of application No. 16/375,552, filed on Apr. 4, 2019, now Pat. No. 10,990,228.

(30) Foreign Application Priority Data

Apr. 26, 2018 (DE) ...................... 10 2018 110 033.7

(51) Int. Cl.
*G06F 3/044* (2006.01)
*B32B 27/08* (2006.01)
(Continued)

(52) U.S. Cl.
CPC .............. *G06F 3/044* (2013.01); *B32B 27/08* (2013.01); *B32B 37/223* (2013.01);
(Continued)

(58) Field of Classification Search
CPC ...... G06F 3/044; G06F 3/0447; G06F 3/0446; G06F 3/0202; G06F 3/016;
(Continued)

(56) References Cited

U.S. PATENT DOCUMENTS 10,514,772 B1 * 12/2019 Wang .................... G06F 1/1669
2007/0115263 A1 * 5/2007 Taylor ................ G06F 3/03547
345/169

(Continued)

FOREIGN PATENT DOCUMENTS

| DE | 102013021879 A1 | 6/2015 |
|---|---|---|
| DE | 102016120906 A1 | 5/2018 |
| DE | 102016123118 A1 | 5/2018 |

*Primary Examiner* — Adam J Snyder
(74) *Attorney, Agent, or Firm* — M&B IP Analysts, LLC

(57) ABSTRACT

The present disclosure relates to an input device and a method of producing the device. The input device includes a flat panel defining an array of control surfaces, a support disposed on a side of the panel facing away from an operator, and a flat film layer structure disposed between the flat panel and the support which defines an array of capacitive sensors; wherein each capacitive sensor forms a measuring capacitance assigned to one of the control surfaces; wherein the support forms at least one web, which protrudes towards the flat panel and connects to the flat panel to fix the film layer structure between the flat panel and the support.

19 Claims, 2 Drawing Sheets

(51) Int. Cl.
*B32B 37/22* (2006.01)
*H03K 17/975* (2006.01)
*G06F 3/02* (2006.01)
*G06F 3/01* (2006.01)
*H03K 17/96* (2006.01)
*G01L 1/14* (2006.01)

(52) U.S. Cl.
CPC ....... *B32B 2457/00* (2013.01); *B32B 2605/00* (2013.01); *G01L 1/142* (2013.01); *G06F 3/016* (2013.01); *G06F 3/0202* (2013.01); *G06F 3/0446* (2019.05); *G06F 3/0447* (2019.05); *G06F 2203/04103* (2013.01); *H03K 17/962* (2013.01); *H03K 17/975* (2013.01); *H03K 2217/96015* (2013.01); *H03K 2217/96042* (2013.01); *H03K 2217/9651* (2013.01); *H03K 2217/9655* (2013.01)

(58) Field of Classification Search
CPC ........... G06F 2203/04103; G01L 1/142; B32B 27/08; B32B 37/223; B32B 2457/00; B32B 2605/00; H03K 17/975; H03K 17/962; H03K 2217/96015; H03K 2217/96042; H03K 2217/9651; H03K 2217/9655
See application file for complete search history.

(56) References Cited

U.S. PATENT DOCUMENTS

| | | | |
|---|---|---|---|
| 2011/0037624 A1* | 2/2011 | Pance | G06F 1/1626 |
| | | | 341/33 |
| 2011/0205161 A1* | 8/2011 | Myers | G06F 3/0238 |
| | | | 345/169 |
| 2016/0259366 A1* | 9/2016 | Kenney | G06F 1/1601 |

* cited by examiner

INPUT DEVICE WITH AN ARRAY OF FORCE SENSORS IN A FILM LAYER STRUCTURE WITH IMPROVED DURABILITY AND SIMPLIFIED PRODUCTION

This application is a continuation of the U.S. patent application Ser. No. 16/375,552 filed on Apr. 4, 2019, now allowed, which claims priority to the German Application No. 10 2018 110 033.7, filed Apr. 26, 2018, now allowed, the contents of which are hereby incorporated by reference.

The present disclosure relates to an input device comprising a flat panel defining an array of control surfaces, and a film layer structure, which defines an array of capacitive sensors, e.g., capacitive force sensors, and a support, wherein the control surfaces are disposed on a surface of the panel facing towards the operator, and the support is disposed on a side of the panel facing away from the operator. Generically, one of the capacitive sensors, respectively, forms one measuring capacitance assigned to one of the control surfaces. The control surface in each case includes a luminous surface. On the side of the support, at least one lighting means is provided for each control surface, for backlighting these luminous surfaces.

This type of input devices, depending on the design of the capacitive sensor, for example, focuses on the exclusive detection of touch, or on the detection of the actuating force exerted in the process, by the capacitive sensors being configured as force sensors. There is in fact an increasing demand for such input devices in which the operator receives a haptic feedback when the operator makes an input on the input surface. In order to better distinguish random contacts on the input surface from intended actuation, and in order to be able to provide the operator, who is used to traditional mechanical operating elements, with a similar haptic feedback, such input devices were developed which permit an actuating force measurement to be able to generate a haptic feedback depending on the measured actuating force.

In the case of input devices with an array of operating surfaces, i.e., with several operating surfaces accommodated in an extended input surface, an array of several force sensors is provided for "spatial resolution". In this case, a force sensor is assigned to each operating surface in order to be able to assign a switching function to an actuation of the individual operating surface, hereinafter also referred to as control surface, e.g., when a measured minimum actuating force of the actuation is exceeded. Compared to piezoelectric sensors, for instance, capacitive sensors are inexpensive, and a force measurement, but also the mere touch detection, with this type of sensor can be realized in a space-saving manner by using a film layer structure.

One drawback with this type of capacitive sensors with a film layer structure is that the production makes great demands with respect to the positioning accuracy and that the permanent maintenance of the position of the film layer structure has to be ensured. On the one hand, this is due to the capacitive detection, which reacts sensitively to inaccuracies and production spread. This applies all the more if a backlighting of parts of the control surfaces is to be realized at the same time, which creates additional problems because of the backlighting being intended to be as uniform as possible. In addition to the required highly precise assembly positioning, the permanent retention of this original positioning has to be ensured under the adverse ambient conditions prevailing in the vehicle. At the time the present disclosure was made, the problems concerning durability and thus, inter alia, permanent reproducibility of capacitive detection were not solved.

Against this background, there was a demand for a solution for an input device with an array of control surfaces and an associated array of capacitive sensors accommodated in a film layer structure, which is improved with regard to durability and production, and which is, in particular, inexpensive to produce. This object is achieved with an input device according to claim 1. An equally advantageous use and a production method are each the subject matter of the independent claims. Advantageous embodiments are in each case the subject matter of the dependent claims. It must be noted that the features cited individually in the claims can be combined with each other in any technologically meaningful manner and represent other embodiments of the present disclosure. The description, in particular in connection with the figures, additionally characterizes and specifies the present disclosure.

The present disclosure relates to an input device comprising a flat panel defining an array of control surfaces, a support disposed on a side of the panel facing away from the operator, and a substantially flat film layer structure, which is disposed between the panel and the support and which defines an array of capacitive sensors. For example, the panel is configured to be elastically more yielding compared with the support and/or movably mounted with respect to the support. According to the present disclosure, the control surfaces are disposed on a surface of the panel facing towards the operator, i.e., disposed so as to be visible from the point of view of the operator, whereas, according to the present disclosure, the support is disposed on a side of the panel facing away from the operator, i.e., underneath the panel from the point of view of the operator. The term "control surface" is to be interpreted broadly, and despite the designation referring to an actuation, a mere touch without the influence of an actuating force is also to be understood to be an actuation in the sense of the present disclosure. According to the present disclosure, the control surfaces each comprise backlightable luminous surfaces and the control surfaces are disposed on a surface of the panel facing towards the operator. According to the present disclosure, the panel, on the side facing towards the support, has a light-conducting layer of transparent of translucent material, which covers the luminous surfaces in a connecting manner and which defines, in particular, a surface facing towards the operator. For example, the light-conducting layer is integrally formed and is in touching contact with all luminous surfaces.

According to the present disclosure, each of the capacitive sensors is provided to respectively form a measuring capacitance respectively assigned to one of the several control surfaces. According to the present disclosure, the capacitive sensor has in each case at least one first electrode which is more closely adjacent to the panel, and is thus designed, for example, to capacitively detect a touch on the associated control surface. Preferably, the capacitive sensor is in each case designed as a capacitive force sensor, and further includes at least one second electrode, which is more closely adjacent to the support, for forming the measuring capacitance between the support and the panel.

For example, the mode of operation of the capacitive sensor, which is preferably configured as a capacitive force sensor, is as follows. When an actuating force acts on the respective control surface of the panel, this results in the first and second electrode converging and thus in a change in the measuring capacitance, which is detected by an evaluation unit and which, when a predetermined minimum change is exceeded, causes a switching state of a unit to be controlled with the input device to change. Preferably, the input device also has an actuating element, also referred to as actuator, for generating a haptic feedback, which is activated at the same time as or subsequent to the assignation of the switching state change by the evaluation unit in order to produce a vibration or impact-like positional change of the input device for generating a haptic feedback.

According to the present disclosure, each of the capacitive sensors is formed by a substantially flat film layer structure common to all capacitive sensors. A film layer structure in the sense of the present disclosure is understood to be, for example, a single-layer film with a unilateral coating. In the case of the capacitive sensors being designed as pure touch sensors, for example, the film layer structure has a film with a unilaterally applied, only partial, metallic coating, wherein these partial coatings, which are electrically insulated from one another, each define an electrode for forming a measuring capacitance. In the case of the capacitive sensors being designed as capacitive force sensors, for example, the film layer structure, for each force sensor, in each case has at least one first electrode which is more closely adjacent to the panel, and at least one second electrode, which is more closely adjacent to the support, for forming the measuring capacitance. This is not to exclude the possibility that at least one electrode of several or all force sensors is configured as a common electrode to the respective or all force sensors.

Preferably, the electrode or the electrodes are formed from a conductive material, for example as a metallic coating of one of the film layers of the film layer structure. For example, the first and second electrodes of the capacitive sensor configured as a force sensor are spaced apart from each other by an elastically yielding intermediate layer, which is integrated into the film layer structure and passes through the film layer structure over the entire surface or forms cushions in some areas, or by a distance layer, which yields comparatively little and which defines a hollow volume in each case between the first electrode and the second electrode.

According to the present disclosure, on the side of the support, which preferably consists of an opaque material, preferably opaque thermoplastic material, at least one lighting means, e.g., a light-emitting diode, preferably with an SMD design, is provided for each control surface, for backlighting the control surface and transmitting light through the light-conducting layer, and which is assigned to the control surface. Backlighting serves for making the luminous surface associated with the respective control surface more easily recognizable or visible to an operator looking at the control surface, or for displaying by means of the luminous surface the switching functionality connected with the respective control surface, for example by a symbol, which is applied to the luminous surface or represented by the shaping of the luminous surface, being backlit.

According to the present disclosure, the support forms one or more webs, which protrude towards the panel and are connected in each case non-positively and/or by substance-to-substance connection, preferably by means of their ends pointing away from the support, to the light-conducting layer, in order to fix the film layer structure between the panel and the support. As a result, a stability-providing connection between the panel and the support is obtained, which is provided not on the peripherally extending edge of the support and/or the panel, but rather within the flat extent of the panel and the support. It is also ensured that the film layer structure is fixed, e.g., clamped, between the support and the panel in a more permanent manner and without any danger of a subsequent positional change with an associated effect on the measuring capacitances.

Preferably, it is provided that the web or webs are disposed in such a way that the end thereof pointing away from the support is disposed between the luminous surfaces. As a result, the web provides for a light shielding effect between the luminous surfaces. The webs prevent "crosstalk" of the backlight from one control surface to another control surface in order thus to improve visual appearance, but also to avoid operating errors, particularly if certain switching states of the switching function associated with the control surface are to be made visible by the kind of backlighting that are associated with the respective control surface. For example, the web extends parallel to the main emission direction of the lighting means.

According to a preferred embodiment, at least the webs of the support, preferably the entire support, are made from a thermoplastic material. In this case, the light-conducting layer is also made from a thermoplastic material. In this configuration, the web, and thus the support, is respectively welded to the light-conducting layer. A welded connection between the support and the light-conducting layer is obtained by ultrasonic welding.

Preferably, the panel is formed by a decorative film that is back-molded with a translucent or transparent thermoplastic material for forming the light-conducting layer.

According to a preferred embodiment, the web or webs are formed so as to reach through the film layer structure, wherein the web, more preferably, is disposed so as to protrude beyond the film layer structure in the direction of the panel in each case.

Preferably, the film layer structure has at least one opaque layer and one or several through-holes for the passage of light from the respective lighting means to the light-conducting layer of the panel. In this case, the web is disposed so as to reach through one through-hole, respectively, of the film layer structure.

Furthermore, the present disclosure relates to the use of the input device in one of its above-described embodiments in a motor vehicle.

The present disclosure further relates to a production method for an input device with the steps described below.

In a step of providing, a flat panel defining an array of control surfaces with a light-conducting layer is provided, wherein the control surfaces each comprise backlightable luminous surfaces and the control surfaces are disposed on a surface of the panel facing towards the operator. In this case, the light-conducting layer, which covers the luminous surfaces and preferably forms a surface facing towards the support, is provided on the side of the panel facing away from the operator. In another step of providing, a support is provided, wherein, on the side of the support, at least one lighting means is provided for each control surface, for backlighting the associated luminous surface of the control surface while transmitting light through the light-conducting layer. The support forms one or more webs protruding towards the panel.

In a step of arranging, a substantially flat film layer structure is disposed between the panel and the support, wherein the film layer structure defines an array of capacitive sensors and each of the capacitive sensors forms a measuring capacitance assigned to one of the control surfaces.

In a subsequent attaching step, the panel and the support are fastened by the web or webs being connected, positively and/or by substance-to-substance connection, to the panel, particularly to the light-conducting layer, in order to fix the film layer structure between the panel and the support. As a result, a stability-providing connection between the panel and the support is obtained, which is provided not on the peripherally extending edge of the combined assembly of the panel and the support, but rather within the flat extent of the panel and the support. It is also ensured that the film layer structure is fixed, e.g., clamped, between the support and the panel in a more permanent manner and without any danger of a subsequent positional change with an associated effect on the measuring capacitances.

According to a preferred variant of the production method according to the present disclosure, there are provided a support production step, which precedes the step of providing and in which the support is made from a thermoplastic material, and a panel production step, which precedes the step of providing and in which the panel is made by back-molding a decorative film with a translucent or transparent thermoplastic material while producing the light-conducting layer.

In the fastening step, the panel and the support are fastened by welding the webs to the light-conducting layer. Preferably, the welding is carried out using ultrasound, for example by placing an ultrasound welding head on the support on the surface facing away from the panel and coupling ultrasound into the support.

The present disclosure is explained further with reference to the following Figures. The Figures are to be understood only as examples and merely represent a preferred embodiment. In the Figures.

Figure 1:
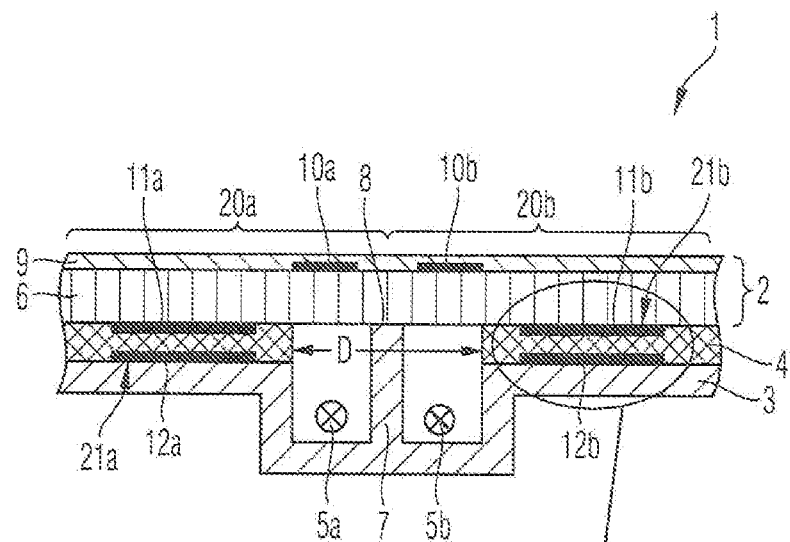
FIG. 1 shows a sectional view through an embodiment of the input device according to the present disclosure.

FIG. 1 shows an embodiment of the input device 1 according to the present disclosure. The input device 1 has an array of control surfaces 20*a*, 20*b*, which is formed on a surface, which faces towards the operator, of a flat panel 2 made from a decorative layer 9 and a light-conducting layer 6 which, viewed from the operator's point of view, is situated thereunder. The transparent layer 6 is formed from a translucent or transparent thermoplastic material and, by back-molding the decorative layer 9, is applied thereto substantially across the entire surface and connected therewith. In order to be found more easily or for displaying a switching state if required, the control surfaces 20*a*, 20*b* have selectively backlightable luminous surfaces 10*a*, 10*b*. For indicating the associated switching function, which is to be activated by the actuation of the control surface 20*a*, 20*b*, corresponding symbols are displayed by means of the luminous surfaces 10*a*, 10*b*.

Figure 2:
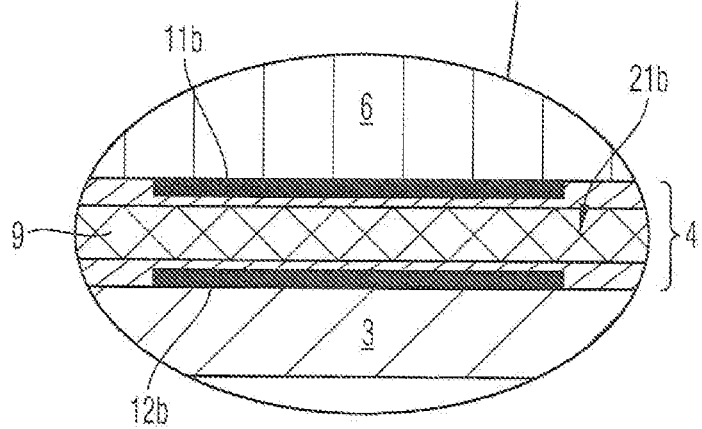
FIG. 2 shows an associated detailed view.
Figure 3:
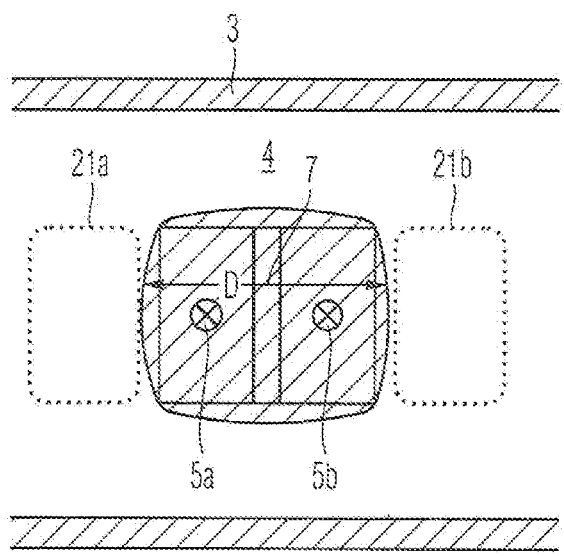
FIG. 3 shows a top view of the support of the embodiment of the input device according to the present disclosure shown in FIG. 1, with the film layer structure 4 disposed thereon.

The input device 1 further has a support 3 made from an opaque thermoplastic material, which is disposed on the far side of the panel 2. A film layer structure 4, which defines an array of capacitive force sensors 21*a*, 21*b*, is disposed between the panel 2 and the support 3, wherein exactly one of the capacitive force sensors 21*a*, 21*b* is assigned to each control surface 20*a*, 20*b*. Each of the force sensors 21*a*, 21*b* is provided for forming, by means of an evaluation unit that is not shown, a measuring capacitance between the panel 2 and the support 3, which is assigned to one of the control surfaces 20*a*, 20*b*. The film layer structure 4, for each force sensor 21, 21*b*, has at least one first electrode 11*a*, 11*b* which is more closely adjacent to the panel 2, and at least one second electrode 12*a*, 12*b*, which is more closely adjacent to the support 3, for forming the above-mentioned measuring capacitance. As FIG. 2 shows in detail, the first electrodes 11*a*, 11*b* are formed as a metallic coating of the surface of a first film of the film layer structure 4 facing towards the panel 2, whereas the second electrodes 12*a*, 12*b* are formed as a metallic coating of the surface of a second film of the film layer structure 4 facing towards the support 3. The film layer structure 4 may have further films or film-like layers. Alternatively, the film layer structure 4 may define an array of capacitive touch sensors. For example, this is a film partially metal-coated on one side, wherein the metallic layers are electrically insulated from one another and serve as electrodes for generating a measuring capacitance. In the embodiment shown in FIG. 1, the film layer structure has an elastically deformable distance layer 9, which is provided between the first film supporting the first electrodes 12*a*, 12*b* and the second film supporting the second electrodes 12*a*, 12*b*, in order to permit an elastic deformation and thus a reversible convergence of the associated electrode pairs 11*a*, 12*a* or 11 *b*, 12*b*, and thus a detectable change in the associated measuring capacitance of the capacitive force sensors 21*a*, 21*b*, when an actuating force acts on the control surfaces 20*a*, 20*b*. On the side of the support 3, one lighting means 5*a*, 5*b* is respectively provided for each control surface 20*a*, 20*b*, for backlighting the associated luminous surface 10*a*, 10*b* associated with the respective control surface 20*a*, 20*b*, while transmitting light through a though-hole D provided in the film layer structure 4 and the light-conducting layer 6. The lighting means 5*a*, 5*b* are configured in an SMD design and disposed on a circuit board, which is not shown in more detail, on the support 3. A web 7 rises from between the lighting means 5*a*, 5*b*. FIG. 3 shows an associated top view of the support 3, which illustrates the structure, from the side of the operator, with the film layer structure 4 disposed on the support 3.

The web 7 reaches through the through-hole D in the film layer structure 4 and, at the end 8 thereof that faces away from the support and is shown in FIG. 1, is connected by substance-to-substance connection to the light-conducting layer 6 of the panel 2 through ultrasonic welding, in order to fix, on the one hand, the film layer structure 4 between the support 3 and the panel 2 in a clamping manner and, on the other hand, fix the support 3 to the panel 2. The web 7 further reduces the passage of light from one luminous surface 10*a* to an adjacent luminous surface 10*b* in order to prevent an undesirable light transfer of the light source 5*b* to the respective other control surface 20*a* or 20*b*.

The invention claimed is:

1. An input device comprising:
   a flat panel defining an array of control surfaces;
   a support disposed on a side of the flat panel facing away from an operator; and
   a film layer structure disposed between the flat panel and the support which defines an array of capacitive sensors;
   wherein each of the capacitive sensors forms a measuring capacitance assigned to one of the control surfaces;
   wherein the support forms at least one web which protrudes towards the flat panel and connects to the flat panel to fix the film layer structure between the flat panel and the support;
   wherein the flat panel further includes a light-conducting layer covering at least a luminous surface in a connecting manner and a plurality of lights for each control surface adapted to backlight the associated luminous surface of the control surface while transmitting light through the light-conducting layer; and wherein the web is structured such that an end thereof that points away from the support connects to the light-conducting layer and protrudes beyond the film layer structure in the direction of the panel.

2. The input device of claim 1, wherein each of the control surfaces is disposed on a side of the flat panel facing towards an operator and further comprises a backlightable luminous surface.

3. The input device of claim 1, wherein the web is structured to be in any one of: a flat extent of the flat panel and the support, between the luminous surfaces, and periphery of the support.

4. The input device of claim 1, wherein the web is made from a thermoplastic material, the light-conducting layer is made from a thermoplastic material, and the support is welded to the flat panel.

5. The input device of claim 4, wherein the panel has a decorative film that is back-molded with a translucent or transparent thermoplastic material for forming the light-conducting layer.

6. The input device of claim 1, wherein the film layer structure includes a plurality of films.

7. The input device of claim 1, wherein the film layer structure includes at least one opaque layer and at least one through-hole, each of the at least one though hole being for passage of light from a respective one of the plurality of lights to the light-conducting layer.

8. The input device of claim 7, wherein the web is disposed so as to reach through one through-hole, respectively, of the film layer structure.

9. The input device of claim 1, configured for use in a motor vehicle.

10. A method for producing an input device comprising:
disposing a film layer structure between a flat panel defining an array of control surfaces and a support on a side of the flat panel facing away from an operator, wherein the film layer structure defines an array of capacitive sensors, wherein each of the capacitive sensors forms a measuring capacitance assigned to one of the control surfaces, wherein the flat panel further includes a light-conducting layer covering at least a luminous surface in a connecting manner and a plurality of lights for each control surface adapted to backlight the associated luminous surface of the control surface while transmitting light through the light-conducting layer; and fastening the flat panel and the support by connecting at least one web which protrudes towards the flat panel to the flat panel to fix the film layer structure between the flat panel and the support, wherein the web is structured such that an end thereof that points away from the support connects to the light-conducting layer and protrudes beyond the film layer structure in the direction of the panel.

11. The method of claim 10, further comprising:
disposing each control surface on a side of the flat panel facing towards an operator, wherein each control surface includes a backlightable luminous surface.

12. The method of claim 10, wherein
forming at least one opaque layer in the film layer structure; and
forming at least one through-hole in the film layer structure, each of the at least one through hole being for passage of light from a respective one of the plurality of lights to the light-conducting layer.

13. The method of claim 10, further comprising: producing a web structure on any one of: a flat extent of the flat panel and the support, between the luminous surfaces, and periphery of the support.

14. The method of claim 10, further comprising:
producing the support from a thermoplastic material, and producing the flat panel by back-molding a decorative film with a translucent or transparent thermoplastic material while forming the light-conducting layer, wherein the web is welded to the light-conducting layer when the panel and the support are fastened.

15. An input device comprising:
a flat panel defining an array of control surfaces;
a support disposed on a side of the flat panel facing away from an operator; and
a film layer structure disposed between the flat panel and the support which defines an array of capacitive sensors;
wherein each of the capacitive sensors forms a measuring capacitance assigned to one of the control surfaces;
wherein the support forms at least one web, which protrudes towards the flat panel and connects to the flat panel to fix the film layer structure between the flat panel and the support;
wherein the flat panel further includes: a light-conducting layer covering at least a luminous surface in a connecting manner, and a plurality of lights for each control surface for backlighting the associated luminous surface of the control surface while transmitting light through the light-conducting layer; and
wherein the web is structured such that the end thereof pointing away from the support connect to the light-conducting layer and reach though the film layer structure protruding beyond the film layer structure in the direction of the panel.

16. The input device of claim 15, wherein each of the control surfaces is disposed on a side of the flat panel facing towards an operator and further comprises a backlightable luminous surface.

17. The input device of claim 15, wherein the film layer structure is includes at least one opaque layer and at least one through-hole, each of the at least one though hole being for passage of light from a respective one of the plurality of lights to the light-conducting layer.

18. The input device of claim 15, wherein the web is made from a thermoplastic material, the light-conducting layer is made from a thermoplastic material, and the support is welded to the flat panel.

19. The input device of claim 18, wherein the panel has a decorative film that is back-molded with a material that is one of the group consisting of: a translucent thermoplastic and a transparent thermoplastic, for forming the light-conducting layer.

* * * * *